United States Patent
Brekelmans et al.

(10) Patent No.: US 7,116,177 B2
(45) Date of Patent: Oct. 3, 2006

(54) PLL CIRCUIT LEAKAGE COMPENSATION CIRCUIT FOR GENERATING A LEAKAGE COMPENSATION SIGNAL

(75) Inventors: Johannes Hubertus Antonius Brekelmans, Eindhoven (NL); Olivier Crand, Epinay sur Odon (FR)

(73) Assignee: Koninklijke Philips Electronics N.V., Eindhoven (NL)

(*) Notice: Subject to any disclaimer, the term of this patent is extended or adjusted under 35 U.S.C. 154(b) by 0 days.

(21) Appl. No.: 10/515,689

(22) PCT Filed: May 13, 2003

(86) PCT No.: PCT/IB03/01857

§ 371 (c)(1),
(2), (4) Date: Nov. 24, 2004

(87) PCT Pub. No.: WO03/100980

PCT Pub. Date: Dec. 4, 2003

(65) Prior Publication Data

US 2005/0174179 A1   Aug. 11, 2005

(30) Foreign Application Priority Data

May 28, 2002 (EP) ................... 02291297

(51) Int. Cl.
*H03L 7/00* (2006.01)

(52) U.S. Cl. .............. 331/16; 331/34; 331/177 R; 331/177 V; 331/117 R; 331/117 FE

(58) Field of Classification Search ............. 331/16, 331/175, 177 V, 34, 177 R, 117 FE, 117 R
See application file for complete search history.

(56) References Cited

U.S. PATENT DOCUMENTS

| 5,659,588 A | 8/1997 | Fiedler |
| 6,054,903 A | 4/2000 | Fiedler ............. 331/17 |
| 6,717,475 B1 * | 4/2004 | McCarthy ........... 331/17 |

FOREIGN PATENT DOCUMENTS

EP   1 237 283 A2   4/2002

OTHER PUBLICATIONS

Frequency Synthesizer Design Handbook, by James A. Crawford, Artech House, 1994, p. 177.*

* cited by examiner

*Primary Examiner*—Arnold Kinkead

(57) ABSTRACT

A PLL circuit with a series coupling of a charge pump, a loop filter and a voltage-controlled oscillator generating an output frequency (f), the voltage-controlled oscillator including tunable devices controlled by a first control signal generated by the loop filter, the PLL circuit includes a leakage compensation circuit for generating a leakage compensation signal to modify a control of the voltage-controlled oscillator, the leakage compensation signal being indicative for a leakage current in the tunable devices of the voltage-controlled oscillator.

5 Claims, 2 Drawing Sheets

PLL CIRCUIT LEAKAGE COMPENSATION CIRCUIT FOR GENERATING A LEAKAGE COMPENSATION SIGNAL

The invention relates to a PLL circuit comprising a series coupling of a charge pump, a loop filter and a voltage-controlled oscillator generating an output frequency, said voltage-controlled oscillator comprising tunable devices controlled by a first control signal generated by the loop filter.

PLL circuits are well known, as basic blocks in e.g. receivers for tuning. The constituents of a PLL circuit are often integrated on a same chip, said chip having an area.

U.S. Pat. No. 6,054,903 describes such a PLL fabricated in an integrated chip, the PLL including a VCO having first and second frequency control inputs and a VCO output. The first frequency control input is coupled to a filter node. An off-chip filter input is coupled to the filter node for coupling to an off-chip loop filter. An on-chip loop filter is coupled between the first frequency control input and the second frequency control input and has a variable time constant. A time constant control circuit is coupled to the on-chip loop filter for controlling the variable time constant. It is observed that the PLL has a relatively complicated control mechanism for the VCO, said control mechanism including a loop for controlling a time constant of the on-chip filter. The control loop and the on-chip filter increase the chip area. A practical upper limit for the values of the integrated capacitors determines a relatively big noise contribution of the loop filter. Spectral purity of the signal generated by the VCO is further affected by a leakage current in the tunable devices of the VCO.

It is therefore an object of the present invention to reduce chip area for obtaining a cheaper PLL as well as obtaining an output signal having a high spectral purity.

In accordance with the invention this is achieved in a PLL as described in the introductory paragraph which is characterized in that it further comprises a leakage compensation circuit for generating a leakage compensation signal to modify a control of the voltage-controlled oscillator, the leakage compensation signal being indicative for a leakage current in the tunable devices.

Under the influence of the leakage signal the spectral purity of the VCO output frequency i.e. the harmonic content of the output frequency depends on factors as temperature and process spread. Therefore it is desirable to reduce this dependence. This object could be achieved using the leakage compensation circuit that generates a leakage compensation signal representing an estimation of a leakage current in the tunable elements of the VCO.

In an embodiment of the invention the PLL further comprises an adder for adding the leakage compensation signal to a second output signal generated by the loop filter, said adder generating a second control signal for the voltage-controlled oscillator. The VCO is normally controlled by a control voltage generated in the loop filter by integrating a current from a charge pump in a capacitor that is part of the loop filter. For reducing and if possible canceling the influences induced by temperature and process spread, the leakage compensation signal is added to the second output signal of the loop filter. The adder could be a voltage adder, a current adder, a charge adder or a combination thereof. It is observed that in case of a current adder the adder is a simple circuit node.

In another embodiment of the invention the loop filter is a third order lead-lag RC filter. When the PLL is not locked the charge pump coupled to the filter generates a periodic, pulse-type current signal having a repetition frequency equal to a comparison frequency. When the PLL is locked an average current supplied by the charge pump becomes substantially zero. However, when the tunable devices draw a current from the loop filter, the frequency of the VCO changes and the PLL reacts by pumping a current for compensating a charge lost by leakage. As a consequence of periodical charging and discharging currents, the magnitude of the VCO control voltage is modulated with the comparison frequency. The loop filter needs to attenuate the charge pump signal having the repetition frequency and higher harmonics for obtaining a steady signal for controlling the VCO. The pole-zero location of the complex transfer function of the loop filter determines the attenuation of high frequency signals having substantially the comparison frequency. The higher the order the bigger the attenuation. The higher the order the more difficult to maintain the PLL loop stability. A third order filter is a practical trade-off between attenuation, cost and PLL loop stability.

In an embodiment of the invention the VCO comprises a plurality of voltage controlled oscillators, each of the voltage controlled oscillators including a LC tank circuit, each of them comprising an inductor connected in parallel to a first pair of controllable capacitors and to a second pair of controllable capacitors, said pairs of controllable capacitors being controlled by the first control signal and the second control signal, respectively. A possible implementation of the VCO would comprise a pair of cross-coupled transistors, said transistors being further coupled to a LC tank circuit. The VCO therefore comprises a plurality of VCOs, each of the VCOs comprising a LC tank circuit and a pair of cross-coupled transistors. The LC tank circuit comprises controlled capacitors that could be varicap diodes, said varicap diodes being coupled in pairs. Each varicap diode has an anode and a cathode, a control voltage being applied via a resistor such that the diode is reversed biased. The first control signal and the second control signal are applied to the first pair of the controllable capacitors and to the second pair of controllable capacitors, respectively.

The first pair of controllable capacitors and the second pair of controllable capacitors are varicap diodes, said varicap diodes having a maximum capacity associated to a first area and a second area, respectively.

In another embodiment of the invention the leakage compensation signal is generated by a current generator comprising a third pair of controllable capacitors having an area substantially proportional to a sum of the first area and the second area. The third pair of controllable capacitors has a substantially same behavior as the first and the second pair of controllable capacitors used in tank circuits. Therefore the current generator generates a leakage compensation signal that depends on spread in process and temperature in the same manner as the leakage currents in the controllable capacitors used in the LC tank circuits. Hence, the leakage compensation signal could be used for compensating the leakage current that affects the frequency generated by the VCO.

The above and other features and advantages of the invention will be apparent from the following description of exemplary embodiments of the invention with reference to the accompanying drawings, in which.

Figure 1:
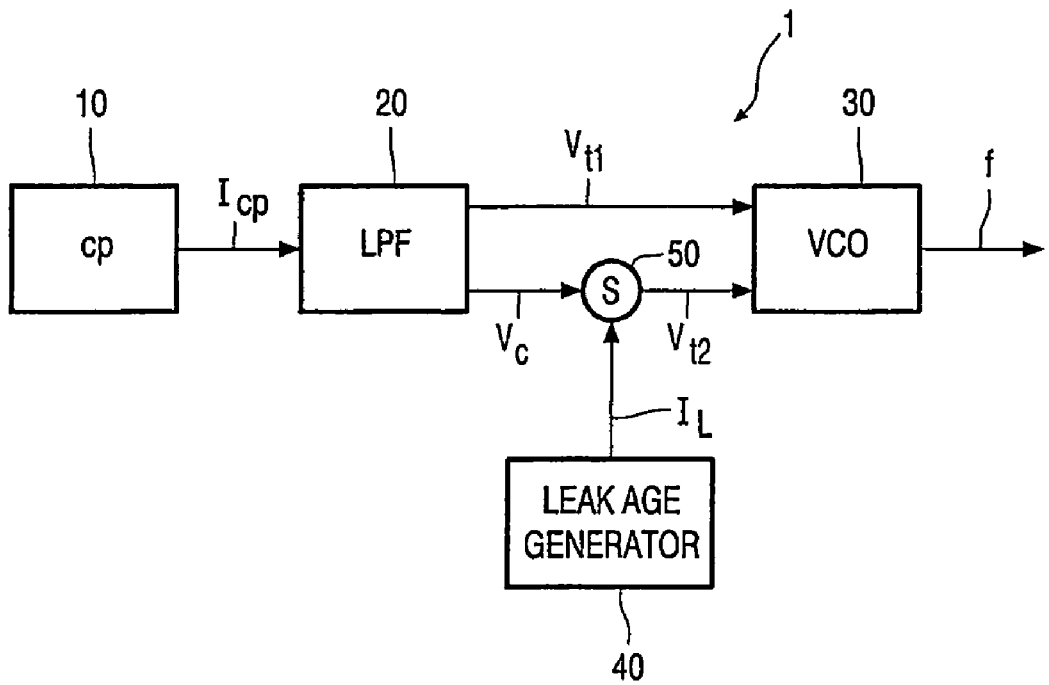
FIG. 1 depicts a PLL according to the invention.

FIG. 1 depicts a PLL according to the invention. The PLL circuit 1 comprises a series coupling of a charge pump 10, a loop filter 20 and a voltage-controlled oscillator (VCO) 30 for controlling an output frequency f generated by the voltage-controlled oscillator 30. The VCO 30 is controlled by a first control signal Vt1 generated by the loop filter 20 and by a second control signal Vt2. The PLL circuit 1 further comprises a leakage compensation circuit 40 for generating a leakage compensation signal $I_L$ that is indicative for a leakage current in the tunable devices of the voltage-controlled oscillator. In modern technology the charge pump 10 and at least the VCO 30 are integrated on the same chip. VCO 30 comprises tunable elements as variable capacitors, variable inductors, variable resistors for generating the oscillation frequency f, the tunable elements being also integrated in the same chip. The tunable elements are controlled by the control signals that are DC signals and could be of electrical nature as voltages, currents, charges or non-electrical signals as optical signals.

The Loop Filter (LPF) 20 generates a first output signal Vt1 that is identical with the first control signal Vt1 applied to the VCO and a second output signal Vc. The output signals depend on a magnitude of charge pump output signal $I_{CP}$, said charge pump output signal depending on the output frequency f and phase of the VCO 30.

The leakage compensation circuit 40 is conceived to generate a leakage compensation signal $I_L$, said leakage compensation signal being indicative for a modification of the VCO spectral purity, the modification depending on variations of the technologic process and temperature. For obtaining a fair estimation for the leakage compensation, the leakage compensation circuit 40 is integrated on the same chip with the VCO 30. The leakage compensation signal $I_L$ is added to the second signal Vc in an adder 50, the adder generating the second control signal Vt2. The second control signal Vt2 is indicative for both the charge pump output signal $I_{CP}$ and the leakage compensation signal $I_L$ determining a better spectral purity of the VCO 30 signal.

Figure 2:
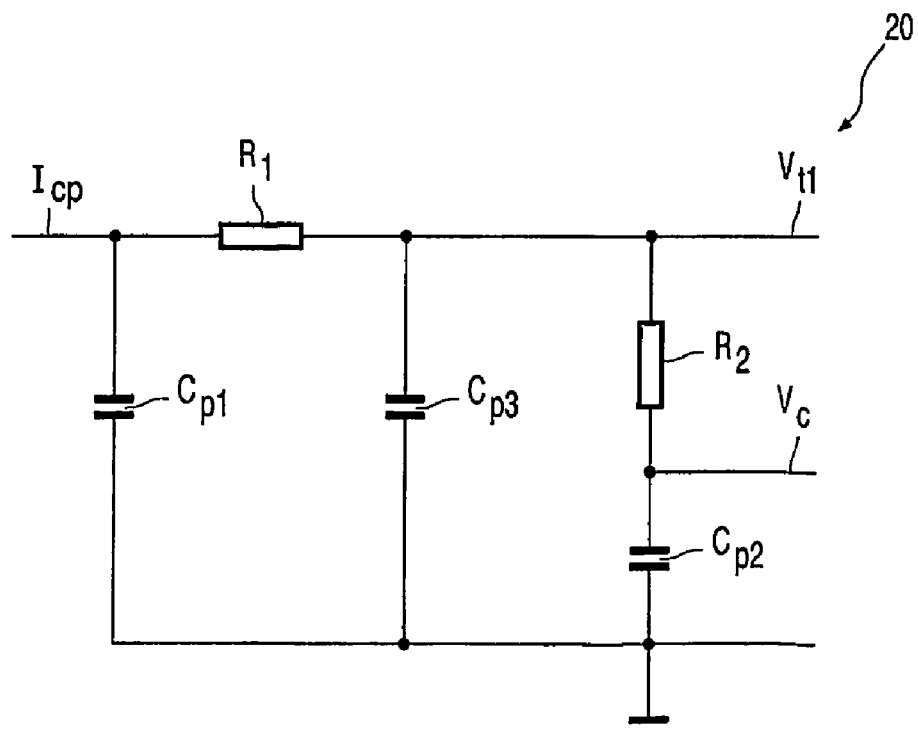
FIG. 2 depicts a loop filter used by the PLL according to an embodiment of the invention.

FIG. 2 depicts a loop filter (LPF) 20 used by the PLL according to an embodiment of the invention. The LPF 20 comprises only resistors R1, R2 and R3 and capacitors Cp1, Cp2, Cp3. Preferably the LPF 20 is an off-chip filter i.e. it is not integrated in the same chip with the VCO 30, charge pump 10 and leakage compensation circuit 40. Use of an off-chip filter has the advantage of an increased flexibility in applications because a transfer characteristic i.e. the poles and the zeroes of the loop filter transfer function could be easier modified by replacing the resistor and/or the capacitors. The poles and the zeroes of the LPF 20 are determined by products of resistors and capacitors of the filter and therefore a change in the resistors and/or capacitors values determines a change of the poles and zeroes location of the LPF 20 transfer function. The first control signal Vt1 and the second signal Vc are voltages on a third capacitor Cp3 and on a second capacitor Cp2. The capacitors are grounded i.e. they are connected to a common reference potential associated to the reference terminal of the controllable tuning elements. By filtering with respect to this reference terminal, the influence of any impurities on the control voltage will have a minimal influence on the VCO frequency. Hence, the LPF 20 with the structure shown in FIG. 2 has the advantage that relatively low noise control signals are generated. Therefore, a high spectral purity of the signal generated by the VCO 20 is obtained.

Figure 3:
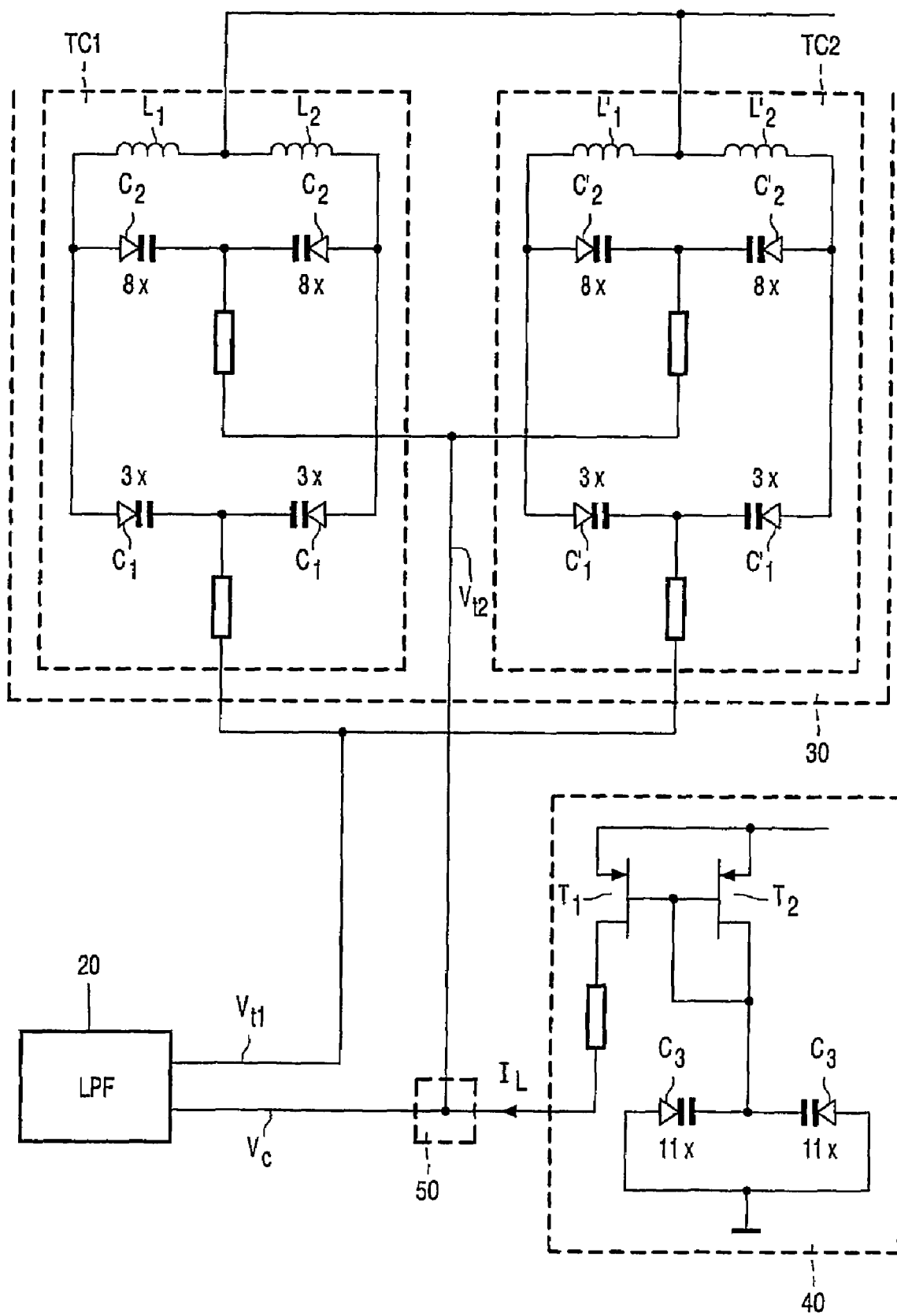
FIG. 3 depicts a leakage compensation circuit coupled to a plurality of tank circuits, according to an embodiment of the invention.

FIG. 3 depicts a leakage compensation circuit 40 coupled to a plurality of tank circuits TC1, TC2 according to an embodiment of the invention. The VCO 30 comprises the plurality of LC tank circuits TC1, TC2, each of them comprising an inductor L1, L1' connected in parallel to a first pair of controllable capacitors C1, C1' and to a second pair of controllable capacitors C2, C2'. The pairs of controllable capacitors are controlled by the first control signal Vt1 and the second control signal Vt2, respectively. The first pair of controllable capacitors C1, C1' and the second pair of controllable capacitors C2, C2' are varicap diodes having a first area A1 and respectively a second area A2. Illustratively the first area is 3 times a reference area x i.e. 3x and the second area is 8x. A tuning characteristic of the LC tank circuits TC1, TC2 depends on these areas. Depending on variations in the process of manufacturing the integrated circuit and variations in temperature there is a leakage current flowing through the varicap diodes C1, C1', C2, C2' said leakage current adversely affecting the spectral purity of the frequency generated by the tank circuits TC1 and TC2 respectively. Hence, in order to compensate the leakage current there is provided a leakage compensation circuit 40 generating a leakage compensation signal $I_L$. The leakage compensation signal $I_L$ is a current generated by a current generator comprising a third pair of controllable capacitors (C3) having an area substantially equal to a sum of the first area A1 and the second area A2 e.g. 11x. The third pair of controllable capacitors is of the same type as the controlled capacitors used in the tank circuits TC1 and TC2 i.e. varicap diodes C3. The varicap diodes C3 have an area equal to a sum of the first area and the second area e.g. 11x. This feature determines that a leakage current of the varicap diodes C3 is substantially proportional to a leakage current of the varicap diodes C1, C2 and C1', C2' respectively. The third pair of varicap diodes C3 is coupled to a current generator comprising a first transistor T1 and a second transistor T2 connected as a diode. The second control signal $I_L$ is generated by the first transistor T1, said current being substantially proportional to the leakage current of the varicap diodes C3. It is observed that in an application comprising more tank circuits e.g. transceivers, tuners the second control signal $I_L$ needs to compensate all the leakage currents in the tank circuits. Hence, considering that a leakage current of a tank circuit is $I_{Li}$, i=1 . . . N, then $I_L$ is substantially equal to a sum of $I_{Li}$, for I=1 . . . N.

It is observed that the noise generated by the leakage compensation circuit is reduced by the capacitor Cp2, said capacitor being directly connected to the reference terminal.

It is further observed that in FIG. 3 the adder 50 is a simple node of the circuit but this does not exclude the use of other types of adders as voltage adders, optical adders.

It is remarked that the scope of protection of the invention is not restricted to the embodiments described herein. Neither is the scope of protection of the invention restricted by the reference numerals in the claims. The word 'comprising' does not exclude other parts than those mentioned in the claims. The word 'a(n)' preceding an element does not exclude a plurality of those elements. Means forming part of the invention may both be implemented in the form of dedicated hardware or in the form of a programmed purpose processor. The invention resides in each new feature or combination of features.

The invention claimed is:

1. A PLL circuit comprising a series coupling of a charge pump, a loop filter and a voltage-controlled oscillator generating an output frequency, said voltage-controlled oscillator comprising tunable devices controlled by a first control signal generated by the loop filter, the PLL circuit being characterized in that it further comprises a leakage compensation circuit for generating a leakage compensation signal to modify a control of the voltage-controlled oscillator, the leakage compensation signal being indicative for a leakage current in the tunable devices of the voltage-controlled oscillator and further comprises an adder for adding the leakage compensation signal to a second output signal generated by the loop filter, said adder generating a second control signal for the voltage-controlled oscillator.

2. A PLL circuit as claimed in claim 1 wherein the loop filter is a third order lead-lag RC filter.

3. A PLL circuit as claimed in claim 1 wherein the VCO comprises a plurality of voltage controlled oscillators, each of the voltage controlled oscillators including a LC tank circuit, each of them comprising an inductor connected in parallel to a first pair of controllable capacitors and to a second pair of controllable capacitors, said pairs of controllable capacitors being controlled by the first control signal and the second control signal, respectively.

4. A PLL circuit as claimed in claim 3, wherein the first pair of controllable capacitors and the second pair of controllable capacitors are varicap diodes having a first area and respectively a second area.

5. A PLL circuit as claimed in claim 4, wherein the leakage compensation signal is generated by a current generator comprising a third pair of controllable capacitors having an area substantially proportional to a sum of the first area and the second area.

* * * * *